United States Patent
Gratrix

(10) Patent No.: US 10,242,905 B2
(45) Date of Patent: Mar. 26, 2019

(54) WAFER PIN CHUCK FABRICATION AND REPAIR

(71) Applicant: M Cubed Technologies, Inc., Newtown, CT (US)

(72) Inventor: Edward J. Gratrix, Monroe, CT (US)

(73) Assignee: M Cubed Technologies, Inc., Newtown, CT (US)

(*) Notice: Subject to any disclaimer, the term of this patent is extended or adjusted under 35 U.S.C. 154(b) by 0 days.

(21) Appl. No.: 15/900,804

(22) Filed: Feb. 21, 2018

(65) Prior Publication Data

US 2018/0182657 A1   Jun. 28, 2018

Related U.S. Application Data

(63) Continuation of application No. 15/062,168, filed on Mar. 6, 2016, now Pat. No. 9,941,148, which is a
(Continued)

(51) Int. Cl.
*B24B 37/04*   (2012.01)
*H01L 21/687*   (2006.01)
(Continued)

(52) U.S. Cl.
CPC ........ *H01L 21/6875* (2013.01); *B24B 37/042* (2013.01); *B24B 37/14* (2013.01);
(Continued)

(58) Field of Classification Search
CPC .............................. B24B 37/042; B24B 37/14
(Continued)

(56) References Cited

U.S. PATENT DOCUMENTS

| 279,001 | A | * | 6/1883 | Morris | ................. B24B 19/226 |
|---|---|---|---|---|---|
| | | | | | 451/271 |
| 412,367 | A | * | 10/1889 | Chandler | ............ B24B 27/0015 |
| | | | | | 451/280 |

(Continued)

FOREIGN PATENT DOCUMENTS

| DE | 10085092 B4 | 8/2007 |
|---|---|---|
| JP | H07/171747 | 7/1995 |

(Continued)

OTHER PUBLICATIONS

International Search Report dated Apr. 12, 2016 for International Application No. PCT/US2015/062231.
(Continued)

*Primary Examiner* — George B Nguyen
(74) *Attorney, Agent, or Firm* — Ramberg IP, LLC

(57) ABSTRACT

In a wafer chuck design featuring pins or "mesas" making up the support surface, engineering the pins to have an annular shape, or to contain holes or pits, minimizes sticking of the wafer, and improves wafer settling. In another aspect of the invention is a tool and method for imparting or restoring flatness and roughness to a surface, such as the support surface of a wafer chuck. The tool is shaped such that the contact to the surface being treated is a circle or annulus. The treatment method may take place in a dedicated apparatus, or in-situ in semiconductor fabrication apparatus. The tool is smaller than the diameter of the wafer pin chuck, and may be approximate to the spatial frequency of the high spots to be lapped. The movement of the tool relative to the support surface is such that all areas of the support surface may be processed by the tool, or only those areas needing correction.

24 Claims, 10 Drawing Sheets

Related U.S. Application Data continuation of application No. PCT/US2015/062231, filed on Nov. 23, 2015.

(60) Provisional application No. 62/084,417, filed on Nov. 25, 2014, provisional application No. 62/083,283, filed on Nov. 23, 2014.

(51) Int. Cl.
   *G03F 7/20* (2006.01)
   *B24B 37/14* (2012.01)
   *B24B 37/16* (2012.01)
   *H01L 21/683* (2006.01)

(52) U.S. Cl.
   CPC .............. *B24B 37/16* (2013.01); *G03F 7/707* (2013.01); *G03F 7/70783* (2013.01); *H01L 21/6838* (2013.01); *H01L 21/68757* (2013.01)

(58) Field of Classification Search
   USPC .................. 451/550, 539, 280, 269, 342
   See application file for complete search history.

(56) References Cited

U.S. PATENT DOCUMENTS

| | | | |
|---|---|---|---|
| 922,382 A * | 5/1909 | Brenizer | B24D 11/00 451/550 |
| 1,651,181 A * | 11/1927 | Bugbee | B24B 13/01 264/261 |
| 2,419,033 A * | 4/1947 | Primus | B24B 37/08 451/269 |
| 3,548,189 A * | 12/1970 | Schroeder | C03C 23/0055 204/192.34 |
| 3,623,276 A * | 11/1971 | McGill, Jr. et al. | B24D 7/00 451/490 |
| 4,010,583 A * | 3/1977 | Highberg | B24B 13/01 228/173.6 |
| 4,043,080 A * | 8/1977 | Maxwell | B24B 5/48 451/123 |
| 4,627,195 A * | 12/1986 | Greenleaf | B24B 37/04 451/270 |
| 4,821,461 A * | 4/1989 | Holmstrand | B24B 37/16 451/38 |
| 4,956,944 A * | 9/1990 | Ando | B24B 13/06 451/159 |
| 5,035,725 A * | 7/1991 | Halpert | B22F 3/222 264/28 |
| 5,138,798 A * | 8/1992 | Volat | B23Q 1/5481 165/77 |
| 5,209,023 A * | 5/1993 | Bizer | B24B 13/01 451/546 |
| 5,336,355 A * | 8/1994 | Zarowin | H01J 37/32082 118/723 R |
| 5,449,313 A * | 9/1995 | Kordonsky | B24B 1/005 451/104 |
| 5,478,271 A * | 12/1995 | Thibaut | B23Q 1/0063 451/342 |
| 5,591,068 A * | 1/1997 | Taylor | B24B 13/00 451/104 |
| 5,800,255 A * | 9/1998 | Hyslop | B24B 13/01 451/550 |
| 6,179,695 B1 * | 1/2001 | Takahashi | B24B 27/0076 451/271 |
| 6,250,997 B1 * | 6/2001 | Hatano | B24B 37/005 451/259 |
| 6,379,230 B1 * | 4/2002 | Hayashi | B24B 27/0023 451/287 |
| 6,513,796 B2 * | 2/2003 | Leidy | B25B 11/005 269/20 |
| 6,530,830 B2 * | 3/2003 | Rich | B24D 9/08 15/230 |
| 6,805,338 B1 * | 10/2004 | Okuda | H01L 21/6838 269/21 |
| 7,430,104 B2 * | 9/2008 | Litman | H01L 21/6831 279/4.02 |
| 8,002,607 B2 * | 8/2011 | Fukuda | B24B 37/005 451/10 |
| 8,524,035 B2 * | 9/2013 | Eisenstock | B24B 37/20 156/345.12 |
| 9,941,148 B2 * | 4/2018 | Gratrix | H01L 21/6875 |
| 2002/0036373 A1 * | 3/2002 | Kosakai | B25B 11/005 269/21 |
| 2002/0078891 A1 * | 6/2002 | Chu | H01L 21/6831 118/715 |
| 2002/0146974 A1 * | 10/2002 | Brandstetter | B24B 45/00 451/550 |
| 2005/0014386 A1 * | 1/2005 | Yoneda | H01L 21/6875 438/759 |
| 2005/0101232 A1 * | 5/2005 | Meissner | B24B 13/01 451/278 |
| 2006/0057942 A1 * | 3/2006 | Kitahashi | B24B 37/30 451/41 |
| 2006/0079162 A1 * | 4/2006 | Yamashita | B24B 53/017 451/444 |
| 2006/0121840 A1 * | 6/2006 | Kim | B24B 7/228 451/342 |
| 2007/0049168 A1 * | 3/2007 | Fujita | B24B 49/12 451/6 |
| 2008/0217291 A1 * | 9/2008 | Higuma | H01J 37/20 216/38 |
| 2009/0042488 A1 * | 2/2009 | Sekiya | B24B 7/228 451/41 |
| 2009/0056112 A1 * | 3/2009 | Kobayashi | H02N 13/00 29/739 |
| 2010/0214549 A1 * | 8/2010 | Cadee | B24B 31/112 355/72 |
| 2010/0279586 A1 * | 11/2010 | Schwappach | B24D 11/00 451/28 |
| 2011/0132396 A1 * | 6/2011 | Humphrey | B08B 1/00 134/6 |
| 2012/0193878 A1 * | 8/2012 | Suzuki | B65G 49/061 279/3 |
| 2013/0094005 A1 * | 4/2013 | Kunnen | G03F 7/70875 355/30 |
| 2014/0137894 A1 * | 5/2014 | Peters | B08B 7/0014 134/19 |
| 2014/0335767 A1 * | 11/2014 | Suratwala | B24B 1/00 451/59 |

FOREIGN PATENT DOCUMENTS

| | | |
|---|---|---|
| JP | H0936070 A | 2/1997 |
| JP | 2008/166616 | 7/2008 |
| JP | 2008300775 A | 12/2008 |
| JP | 2010/153407 | 7/2010 |
| JP | 2014103359 A | 6/2014 |
| JP | 2014128877 A | 7/2014 |
| WO | WO 2005/012592 | 2/2005 |
| WO | WO 2011/002881 | 1/2011 |
| WO | WO 2013/113568 | 8/2013 |
| WO | WO 2013/113569 | 8/2013 |

OTHER PUBLICATIONS

Marcin Golabczak, "Polishing of Hard Semiconductor Materials Made of Silicon Carbide", *Mechanics and Mechanical Engineering*, Technical University of Lodz, Lodz, Poland, vol. 15, No. 1, (2011).

International Search Report dated Jan. 10, 2017 for International Application No. PCT/US2016/046436.

International Search Report dated Oct. 28, 2016 for International Application No. PCT/US2016/046216.

International Search Report dated Feb. 3, 2017 for International Application No. PCT/US2016/046335.

International Search Report dated Jan. 17, 2017 for International Application No. PCT/US2016/046439.

(56) References Cited

OTHER PUBLICATIONS

Eric W. Weisstein, *CRC Concise Encyclopedia of Mathematics*, pp. 46 and 1184, CRC Press 1999.

* cited by examiner

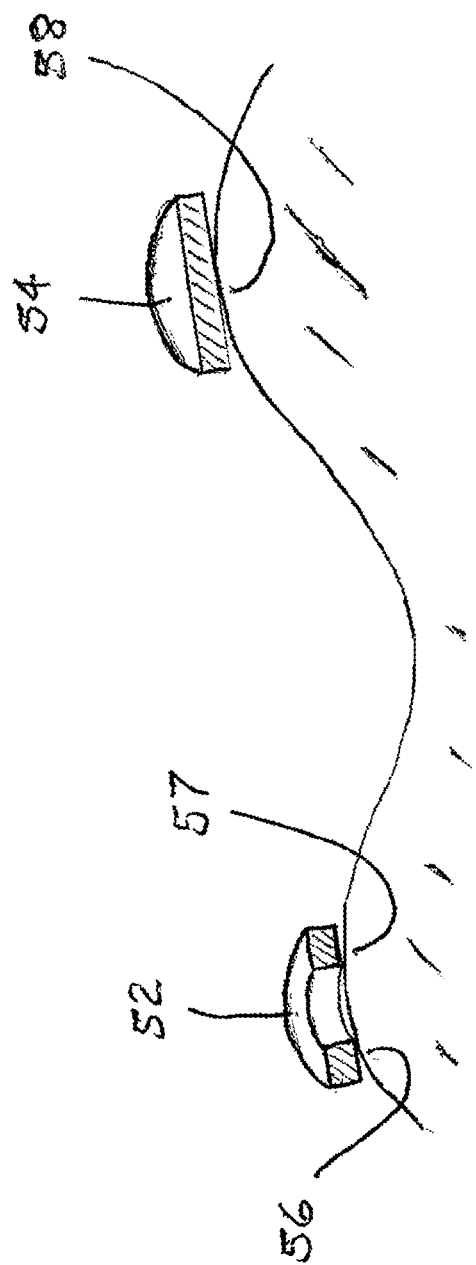

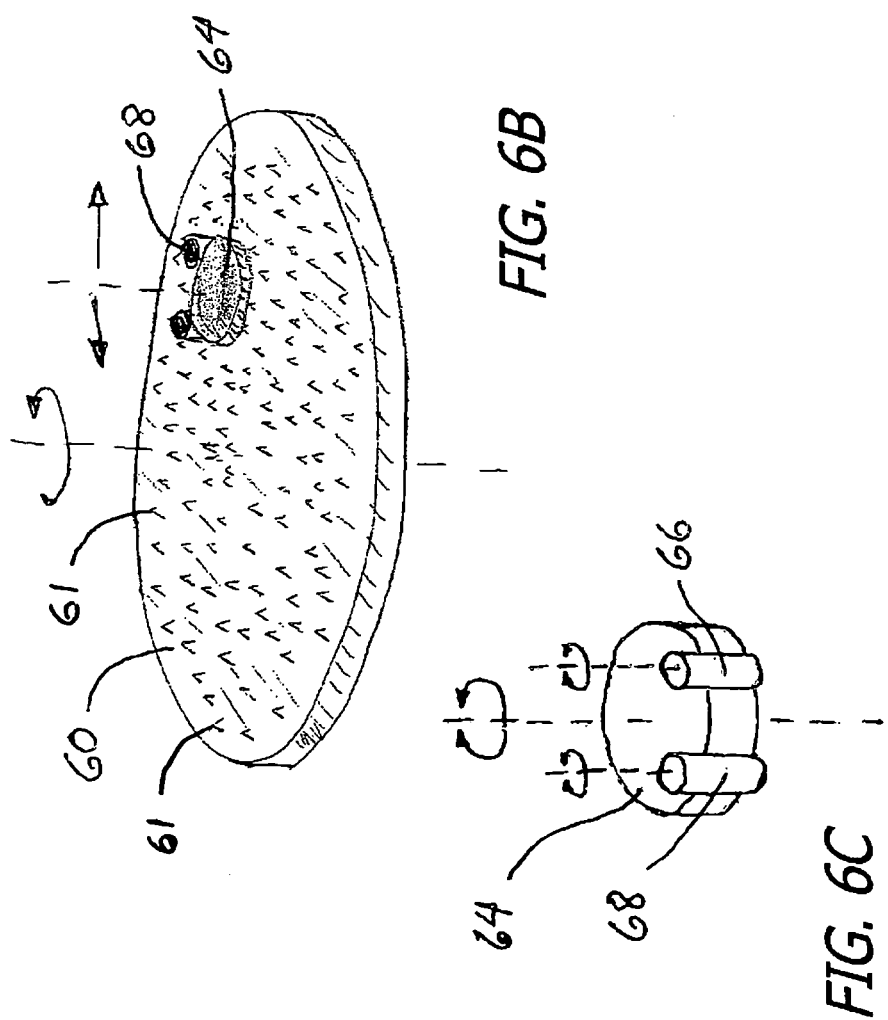

WAFER PIN CHUCK FABRICATION AND REPAIR

CROSS-REFERENCE TO RELATED APPLICATION(S)

This patent document is a Continuation of International Application No. PCT/US2015/062231, filed on Nov. 23, 2015, which international application claims the benefit of U.S. Provisional Patent Application No. 62/084,417, filed on Nov. 25, 2014, as well as U.S. Provisional Patent Application Ser. No. 62/083,283, filed on Nov. 23, 2014, each entitled "Pin chuck fabrication and repair", and each in the name of Edward Gratrix. The entire contents of each of these parent patent applications is incorporated by reference herein.

STATEMENT REGARDING U.S. FEDERALLY SPONSORED RESEARCH

None.

BACKGROUND OF THE INVENTION

1. Field of the Invention

The present invention relates to structures known as "chucks" for supporting wafers such as semiconductor (e.g., silicon) wafers for processing, which could be, but is not limited to, lithography. It furthermore relates to tools for lapping such chucks to impart a desired flatness and roughness, particularly after the chuck has been in service; that is, it also relates to tools for the repair of chucks.

2. Discussion of Related Art

As Moore's Law pushes semiconductor feature sizes smaller and smaller, the need for highly precise wafer handling components grows. The difficulty in achieving the required precision also grows. For instance, the silicon wafers upon which are to be manufactured the microprocessor chips must be precisely placed in the processing machines. The wafers typically are handled by vacuum handling equipment. The wafers droop, ever-so-slightly under their own weight. When lowered to a wafer chuck, the drooping wafer "wants" to flatten out, but may be hindered from doing so by friction between the wafer and chuck. This is sometimes referred to as a "stickiness" problem. Metal oxides are notable in this regard, and silicon dioxide is no exception. Among the efforts to solve, or at least ameliorate, this problem, have been to minimize the contact area between the wafer and the chuck. This particular engineering solution may take the form of designing a plurality of "plateaus" of uniform height, typically regularly spaced, into the wafer. These plateaus are called "pins" or "mesas", the pins defining a very flat support surface upon which a semiconductor wafer may be placed. The pins help in reducing the friction so that the wafer can move laterally across the mesas as it flattens out upon settling on the mesas. The pins help to reduce wafer sticking, but further improvements in this regard are needed.

With this in mind, key desired features for wafer handling components are high mechanical stability (high stiffness and low density), high thermal stability (high thermal conductivity and low coefficient of thermal expansion), low metallic contamination, machinability to high tolerance, low wear (to maintain precision), low friction (to prevent wafer sticking), and the ability to be fabricated to sizes of up to 450 mm.

Silicon carbide (SiC) has desirable properties for use as a wafer chuck: low density, low thermal expansion coefficient, and high thermal conductivity, to name three.

Silicon carbide—based bodies can be made to near net shape by reactive infiltration techniques, and such has been done for decades. In general, such a reactive infiltration process entails contacting molten silicon (Si) with a porous mass containing silicon carbide plus carbon in a vacuum or an inert atmosphere environment. A wetting condition is created, with the result that the molten silicon is pulled by capillary action into the mass, where it reacts with the carbon to form additional silicon carbide. This in-situ silicon carbide typically is interconnected. A dense body usually is desired, so the process typically occurs in the presence of excess silicon. The resulting composite body thus contains primarily silicon carbide, but also some unreacted silicon (which also is interconnected), and may be referred to in shorthand notation as Si/SiC. The process used to produce such composite bodies is interchangeably referred to as "reaction forming", "reaction bonding", "reactive infiltration" or "self bonding". In more recent technology, for added flexibility, one or more materials other than SiC can be substituted for some or all of the SiC in the porous mass. For example, replacing some of this SiC with diamond particulate can result in a diamond/SiC composite.

It is critical that wafers lie flat against the support surface(s) of the chuck. Otherwise, the circuit pattern images that are projected onto the wafer may be out-of-focus. Furthermore, wafer lithography may involve multiple exposures, with re-location of the wafer between exposures. Thus, it is critical that there be a way to precisely re-align the wafer on the chuck relative to its first positioning so that the subsequent exposures will take place in the correct position on the wafer.

3. Wafer Contamination and Wafer Landing

Why are wafers not flat to begin with? When wafers are processed and by inherent limitations of the manufacture they are not flat. Often processes performed in the front-end semiconductor line add films to the wafer, which results in more-or-less curved wafers. This curvature can be any direction, upward or downwards. The majority of the departure from flat is in curvature and deformation is as a sphere and or cylindrical shape.

Additionally, wafer chucks are never perfectly flat, and often have a slight curvature in a random, manner and orientations like that of a wafer in upwards (bowl) or downwards (dome) shape.

When wafers are located on the wafer chuck that have picked up a curvature due to normal process, they are required to return to the original clamping location by settling to flat. The wafer is required to relax in a manner that is predominately radial.

4. Flatness

Flatness of a part is commonly achieved by one of several well-established methods well known to those experienced in the optical, machining or precision industry.

In a first such method, annular grinding for flat lapping or continuous grinder (CG) uses a table that is maintained as a reference surface more-or-less by external features such as rings or a predominate part called a 'bruiser' or 'conditioner'. There are geometric constraints such as the annular width and diameter of the lap in relation to the part required to be flat and well controlled and repeatable. A constraint to achieve a flat part using table lapping (CG) is that the lapping table needs to maintained to a level of flatness at or better than the desired outcome. Additionally, the uniformity of the pressure and the relative velocity between the parts need to be maintained and controlled. Finally, material uniformity, localized pressure and lap media non-uniformity will cause local and global flatness deviations.

A second approach is to use an 'over arm' or 'spindle lapping' in which there are two configurations. First, the part to be lapped is moved across a larger flat polishing surface that is spinning, or secondly, the smaller lap tool is moved across the larger part. In each case the relative geometry of the parts are performed in approximately a random manner so the part sees a flat or uniform profile, thereby resulting in a flat part. The tool trajectory profile, pressure uniformity and media distribution all need to be tightly controlled to minimize variations while this is performed.

Each of the mechanical techniques listed above have no direct control of mid and small frequency errors that deviate from flat. Globally, these techniques provide control over a simple geometric shape like a sphere, but rely on uniformity to achieve smaller spatial periods.

Deterministic correction is a final engineering-intensive method, which uses a measurement of the surface and a small tool to use controlled, localized tool impingement. These tools can be mechanical which work by controlling the tool shape, dwell time, pressure, velocity, media (in the MRF), etc. Alternatively, the process can be more sophisticated using etchants, plasma, ions or other localized phenomenon and controlling dwell, tool size, chemistry, current, concentration, etc. The limitations of these techniques is the magnitude of the metrology for feedback to generate the 'hit map'. The metrology must exceed the level of precision that one intends to implement. Failure to do this will result in the addition of more errors.

Often the highest performing flatness is achieved by the application of one or more mechanical techniques, and is followed by a mid and high frequency correction using more advanced methods called deterministic correction. This forces manufacturers and users to invest in more expensive machinery and sophisticated metrology.

When extending conventional techniques listed above to a surface of a wafer chuck with a plateaued, pixilated, pinned or often called a 'bed of nails' contact area, conventional machining as described above runs into significant challenges in achieving and maintaining flatness. The challenge is that the plateaued surface may have non-uniform pin distribution, which will result in localized pressure variation, hence flatness variation. Additionally, the pin structure will greatly interfere with loose abrasive media by disrupting the media (grit) distribution. The control of local areas on conventional laps is very difficult and costly and often relies on reducing the material removal rate so the part traverses over different regions of a lap surface many times, resulting in longer process times.

The geometrical constraint of a plateaued surface further limits the techniques by which deterministic correction can be applied. MRF, plasma and CCOS are incapable of dealing with discrete regions, particularly with sparse non-repeating patterns found in the pin structure of wafer chucks due to their need for a continuous surface.

Wafer chucks and the discrete reticulated surface are specified to perform with very stringent mid and high spatial frequency flatness deviations; thus, conventional technologies are struggling to maintain the required evolutionary improvements. The mid and high frequency demand is set forth by the manufacturer of the lithography equipment, whereby the systems measure and pre determine and correct for spatial frequencies larger than the illumination area, such as in the twin scan system of ASML. Typical illumination regions are a rectangle 28 mm by 8 mm; thus, the spatial frequencies of interest to maintain flatness are those less than 28 mm.

SUMMARY OF THE INVENTION

In a first aspect of the invention, the pins of a reticulated wafer chuck are engineered such that their top surface (or terminal surface) is annular (ring shaped), or pitted. In a second aspect of the invention is a tool and method for imparting or restoring flatness and roughness to a surface, such as the support surface of a wafer chuck. The tool is shaped such that the contact to the surface being treated is a circle or annulus. The treatment method may take place in a dedicated apparatus, or in-situ in semiconductor fabrication apparatus.

BRIEF DESCRIPTION OF THE DRAWINGS

FIG. 5 is a cross-section view of annular and disc-shaped tools, respectively, in contact with a non-flat surface of an article to be lapped.

FIGS. 6A and 6B show top (plan) and perspective views of a lapping machine arranged to be used in conjunction with a lapping tool of the present invention. FIG. 6C is a backside perspective close-up view of the lapping tool and rollers.

DETAILED DESCRIPTION OF EMBODIMENTS OF THE INVENTION

1. Pin Chuck Mesa Design for Minimizing Sticking and Improved Wafer Settling

The first aspect of the invention pertains to engineering the plateaus or "mesas" or "pins" (this feature will mostly be referred to hereafter as "pins") of a wafer pin chuck to minimize sticking of the wafer, and to improve wafer settling.

With specific regard to the wafer settling issue, when a wafer is initially placed into position on the support surface defined by the pins, it is actually desirable that there be pockets of trapped gas (e.g., air) between the wafer and the pins, to help support the wafer. Once in position, the applied vacuum causes the release of the gas from the isolated pockets, and the wafer settles onto the pins. In the absence of these isolated pockets, the gas may not be trapped initially. Instead, it may find a "leak path". Without this initial support by the gas, the wafer can make a rapid hard contact with the pins during the positioning process. Among the undesirable outcomes in this situation is the occurrence of non-repeatable clamping errors.

Figure 1A:
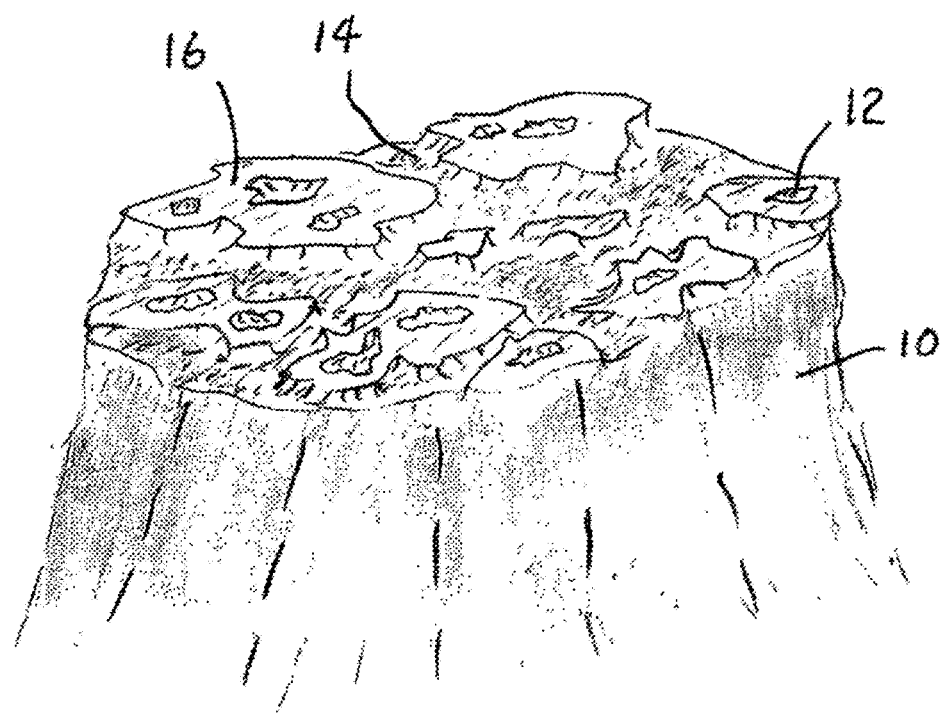
FIG. 1A is a perspective-view drawing illustrating a pitted wafer chuck pin.
Figure 1B:
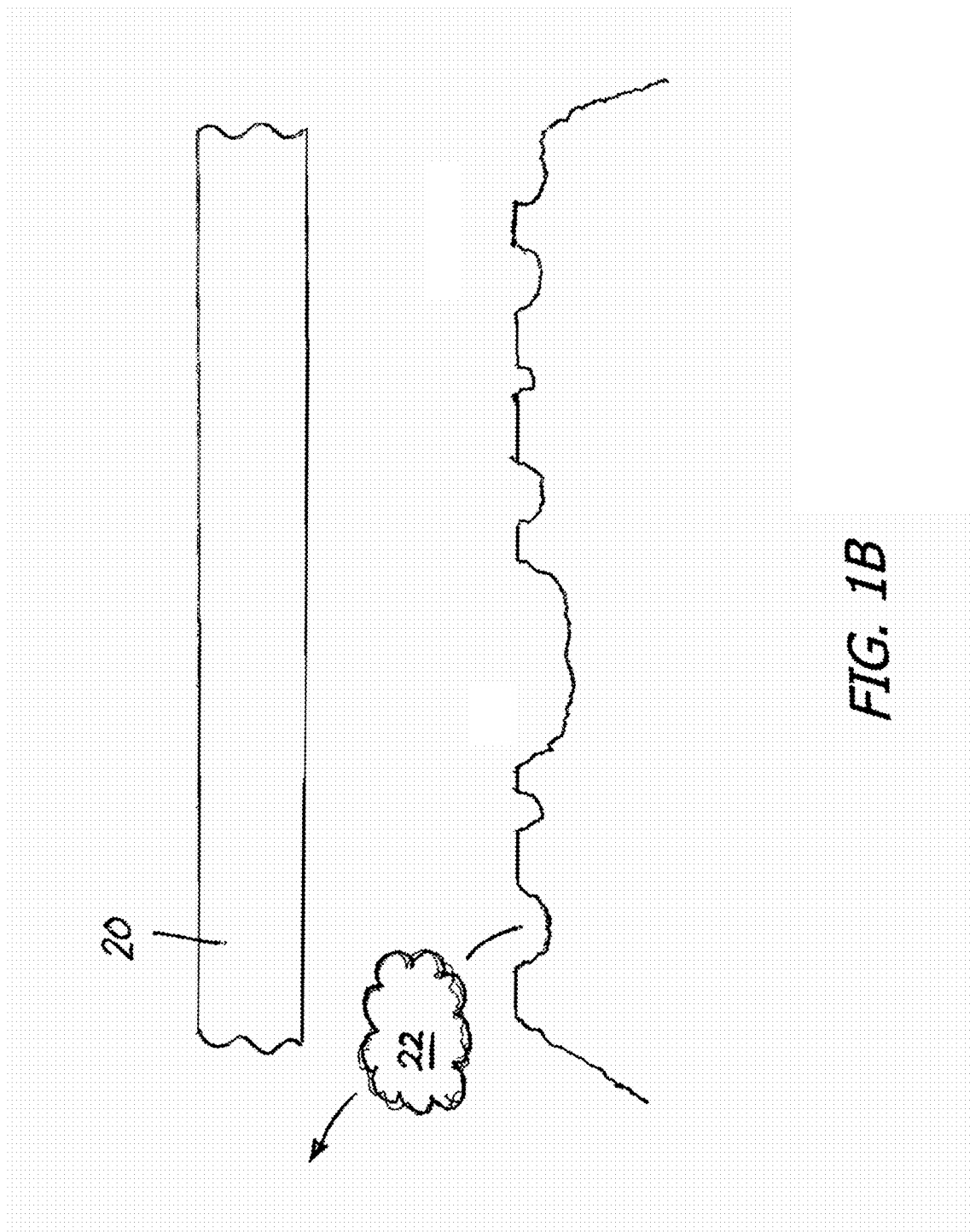
FIG. 1B is a cross-sectional view of FIG. 1A, also showing wafer 20 and escaping gas 22.
Figure 2A:
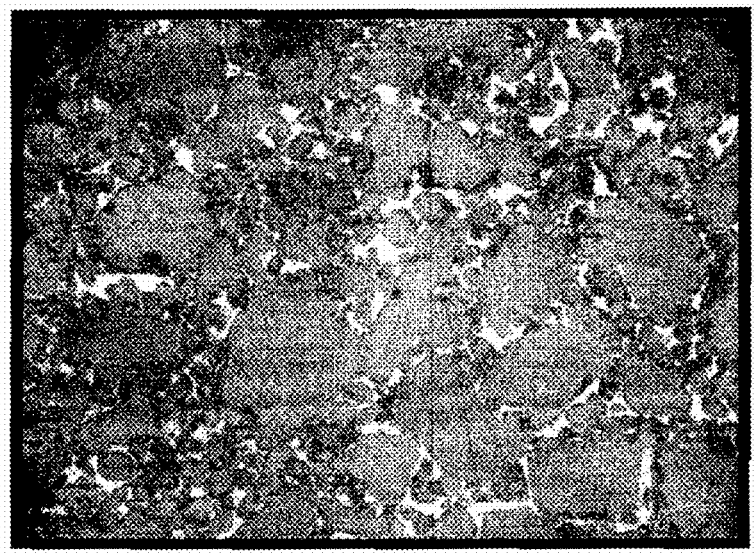
FIGS. 2A and 2B are optical photomicrographs showing unbroken SiC grains, and pitted SiC grains, respectively.
Figure 2B:
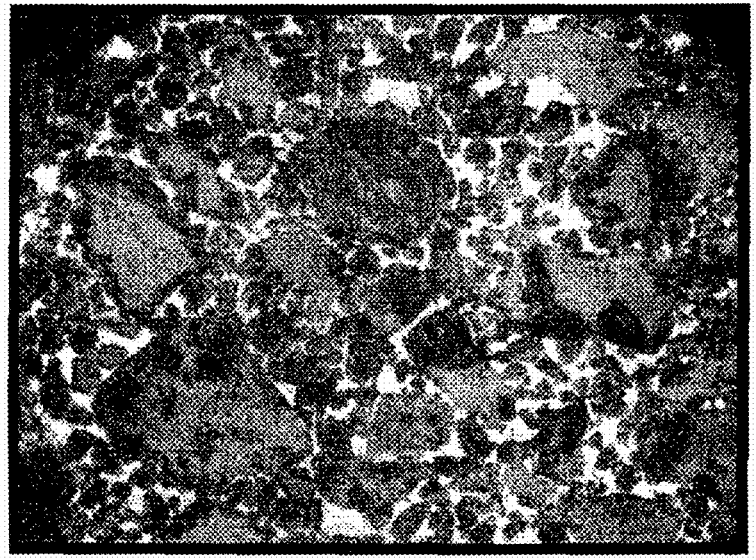

One technique for creating pockets on the terminal surface of the pins (that is, the surface that supports the wafer) is to deliberately introduce the pockets or pits into this surface, for example, by laser or electro-discharge (EDM) machining. FIG. 1A is a perspective-view drawing illustrating a wafer chuck pin 10 having bearing surface 16 that has been engineered by machining to have both closed-end (e.g., "blind") holes 12, as well as open-ended holes 14. FIG. 1B is a cross-sectional view of FIG. 1A, also showing wafer 20 and escaping gas 22. FIGS. 2A and 2B are optical photomicrographs of a polished terminal surface of a pin of a pinned wafer chuck, where FIG. 2A does not have pockets or pits, and FIG. 2B does exhibit such holes.

Figure 3:
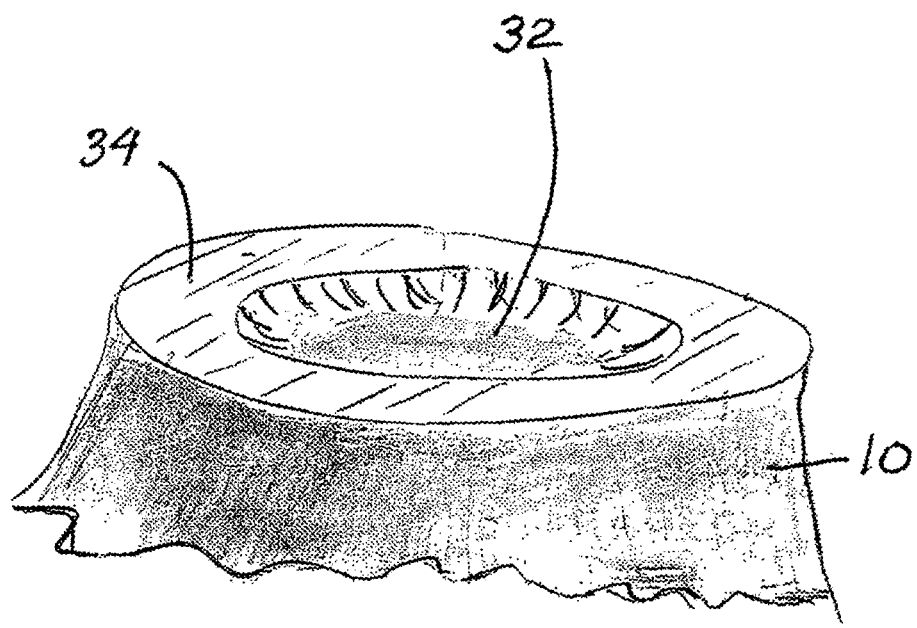
FIG. 3 is a perspective view of a single pin of a wafer chuck shaped as an annulus, that is, having a single hole or depression in the center.

Another approach along these same lines is to machine one large hole in the middle or center region of the pin terminal surface. Here, a depression 32 is machined out, leaving an annulus or annular contact area 34 around the periphery of the pin 10. This is illustrated in the perspective-view drawing of FIG. 3.

These techniques reduce friction between the wafer and the wafer chuck support surface. The reduced friction helps in settling of a wafer on the pins of the support surface independent of any bow of the wafer, and independent of the roughness of the backside of the wafer.

2. Roughness Correction of Pin Chuck While Maintaining Flatness

The second aspect of the invention pertains to correcting the roughness of a pin chuck while maintaining flatness.

Another problem occurs during manufacture of the wafer chucks. The support surface of the chuck is lapped to provide a surface of extreme flatness. Occasionally, there is added a post processing technique like ion beam (e.g., IBF).

The lapping process typically involves a fixed or bound abrasive. Due to inherent limitations in the uniformity of conditions to maintain flatness and roughness, often flatness is achieved at the expense of roughness. More exactly, local or global flatness may be improved, but roughness is reduced. This is at least a potential problem because if contacting surfaces are too smooth, they will stick together. What is needed is a way to achieve the required flatness as well as the required roughness.

An embodiment of the present invention solves the roughness problem. Specifically, it imparts, maintains or restores roughness to the terminal surfaces (pin tops) of the pins by lapping with a tool that has about the same hardness as that of the surface being treated. Preferably, the lapping tool has the same composition as the surface being treated.

3. Description of the Lapping Tool

The lapping tool may be in the general shape of a disc or "puck". The tool should be sufficiently large that it can be moved over the surface defined by the pin tops with minimal constraint, for example, unconstrained in the z-axis, and not fall down between adjacent pins. An overall length or diameter of about 18 to 28 mm is typical. The lapping tool may be arranged to pass over the entire surface of the wafer chuck, contacting each pin terminal surface one or more times.

The lapping tool should have at least the same hardness as the support surface of the wafer chuck being treated. Since the wafer chuck typically is fabricated from a hard material such as ceramic, the lapping tool should be at least this hard. Materials of this degree of hardness will abrade rather than polish the tops of the support surfaces (e.g., pins), and this is what is desired in this application. By having a greater hardness, most of the wear due to abrasion will go into the wafer support surface rather than the lapping/treatment tool. This can be achieved by incorporating diamond into the lapping tool. An interesting thing happens when the lapping tool has about the same hardness as the wafer support surface, and that is that roughness is maximized. In general, abrading materials of similar hardness leads to high roughness.

A popular choice for, the wafer chuck material is silicon carbide, SiC. Thus, the lapping tool may be fabricated from SiC, or based on SiC ceramic. As processing approach for making SiC-based ceramics that affords flexibility is the reaction-bonding technology, as described above. The reaction bonding process typically leaves a small amount of residual elemental silicon in the formed body, so the resulting product is a composite of SiC and Si, often denoted Si/SiC. Some of the SiC is provided as a reinforcement filler, for example, as particulate. Some of all of this SiC filler can be replaced with other reinforcements such as boron carbide or diamond, thereby engineering different properties of the lapping tool. The Si content can be designed to be between about 5 percent by volume and about 45 percent. The $B_4C$ content can be designed to be between about 10 vol % and about 65 vol %. The diamond content can be designed to be between about 0.1 vol % and about 60 vol %.

4. Flatness Correction of Pin Chuck While Maintaining Roughness

The lapping or treatment tool may also be used to impart, maintain or restore flatness to the wafer support surface of a wafer pin chuck. In general, flatness is achieved by grinding down high points until they are the same elevation as the low points. A typical experience is that repeated (e.g., thousands of times) setting and removing of silicon wafers onto the pins of a wafer chuck wears the pin tops, particularly around the outer periphery of the chuck. Thus, to restore wafer flatness, it is necessary to wear down non-worn pins until they are at the elevation of the worn pins.

In wafers and wafer chucks at least, flatness problems often have a periodicity or "waviness" to them—waves of high and low spots for example. How frequently these errors occur can be expressed as a "spatial frequency". Errors whose periodicity is greater than the size of the die (microprocessor chip) are of little relevance since the wafer will eventually be sliced up to recover the dies printed thereon. Errors whose periodicity is less than the spacing between adjacent pins has no meaning. Very high frequency errors, such as those within a pin top, are not relevant, as they will not affect the accurate positioning of a wafer. Thus, the range of spatial frequencies of concern have a periodicity between the pin spacing and the die size, or between about 3 mm and 28 mm.

Figure 4A:
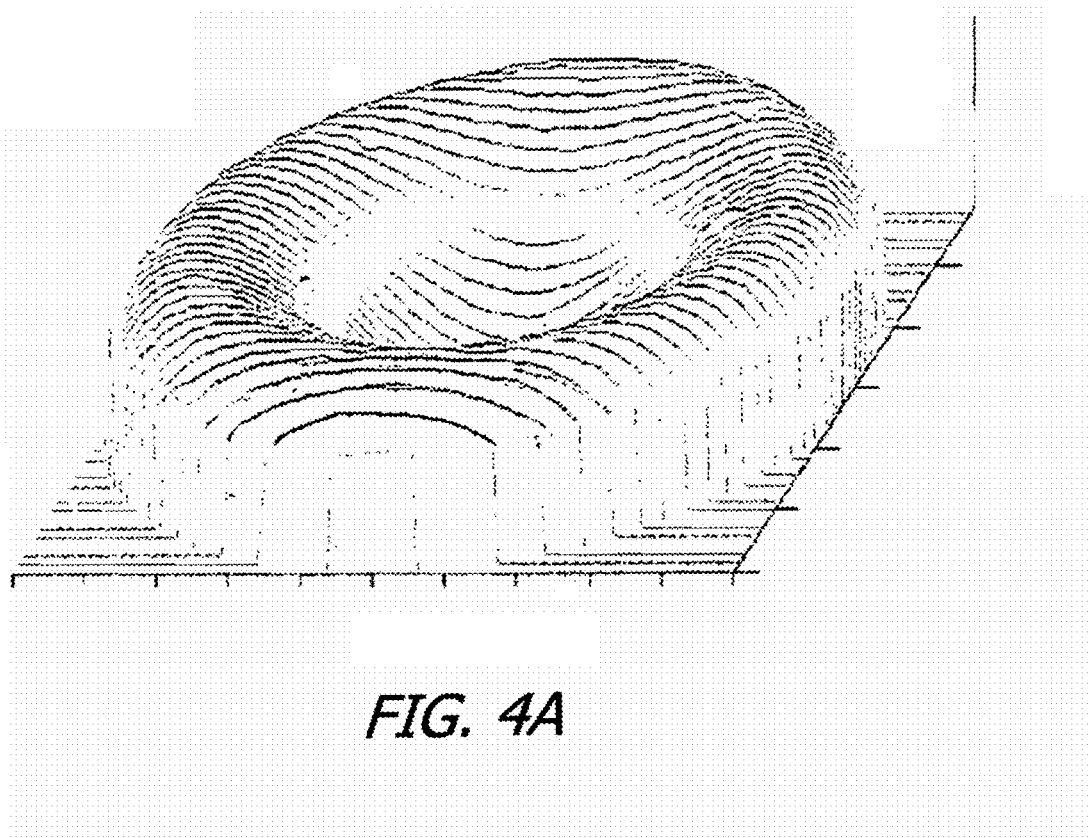
FIG. 4A is an interferometer map showing the toroidal shape of the lapping tool.
Figure 4B:
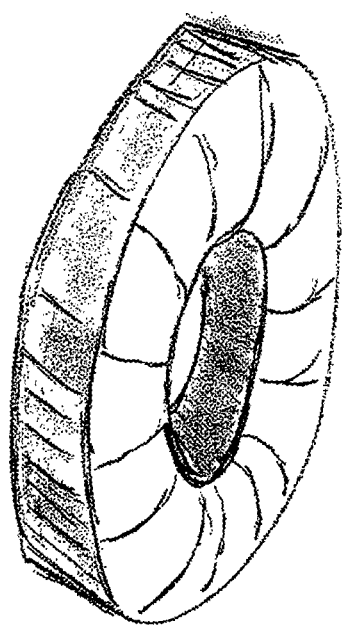
FIG. 4B is a perspective view of an annulus shaped tool for flattening and roughening a wafer chuck.
Figure 4C:
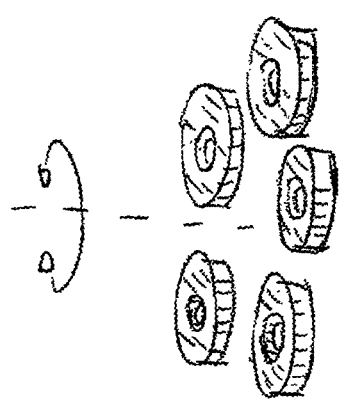
FIG. 4C is a perspective view of an alternate embodiment of a wafer chuck flattening/roughening tool, namely a collection of annular sub-tools arranged in a circle.

The treatment tool of the present invention is sized to be able to treat errors (high spots) in this range of periodicity. Moreover, it is shaped to preferentially treat (e.g., abrade) high spots. Although the tool may have the general and overall shape of a disc, not all of the surface of the tool that is adjacent to the pins is in contact with the pins. Instead, the region of the tool that actually contacts the pins during lapping is a line that closes on itself such as an oval or ellipse. More specifically, this closed loop may be a circle or annulus, that is, a ring having an outer diameter and inner diameter. Although the adjacent surface of the tool may be continuous, the central or middle region of the tool may be recessed; thus, this central or middle region does not contact the pins. The same may also be true of the very outer edge of the adjacent surface: it may feature a lip, radius or "turned-up edge". These recesses are well illustrated by the interferometer image of the tool as shown in FIG. 4A. Thus, the tool may be thought of as having a toroidal or "doughnut" shape, as suggested by the perspective drawing of FIG. 4B. Furthermore, the lapping or treatment tool may feature a plurality of annular or toroidal "sub-tools" arranged in a group, for example, approximating a circle, as suggested by the perspective view of FIG. 4C.

The recessed outer and inner edges of the annular contact region are useful for making a gradual transition as the tool passes over a high spot. In the absence of these recesses, the tool would abruptly impact the high spot. The recessed middle or central region of the tool also serves another role in that it permits the tool to treat high spots while maintaining contact with adjacent lower spots (e.g., pins of lower elevation). In other words, the tool maintains conformity as it traverses over the pin tops. This is best illustrated in FIG. 5 by the cross-sectional view of a wavy, non-flat surface being treated (lapped) by a toroidal tool 52 of the instant invention, and a flat-bottomed tool 54. The toroidal tool 52 bridges 56, 57 long period variations, whereas the flat-bottomed tool does not, instead, making point contact 58. Thus, the toroidal tool can be said to "conformally treat" the pin tops.

Accordingly, as long as the circle or area of contact on the tool is flat, the tool does not have to be held in any kind of rigid or precise fixed orientation in the lapping machine during the lapping process. Rather, it can be attached to the machine using a ball-and-socket joint, or other attachment means of minimal constraint.

5. The Lapping Machine and Lapping Process

Figure 6A:
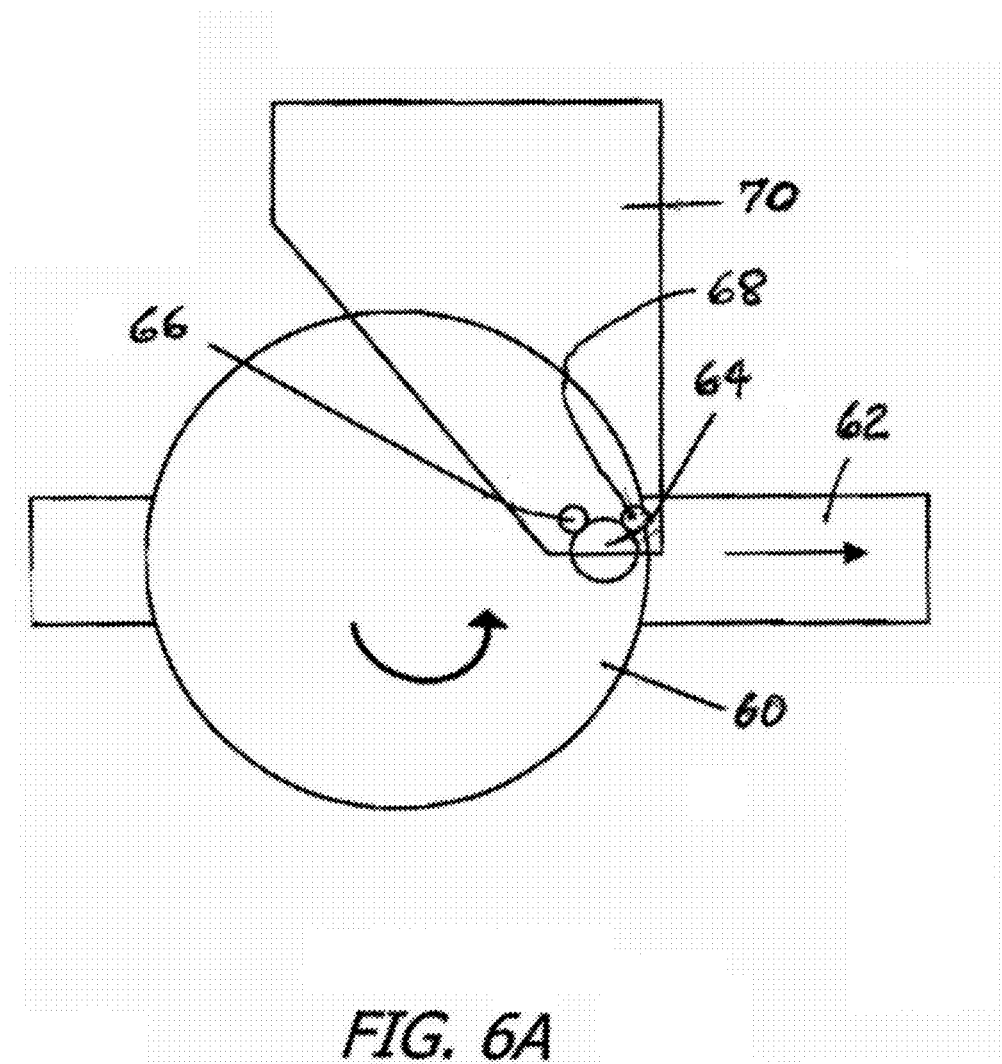

FIGS. 6A and 6B show top (plan) and perspective views of a lapping machine arranged to be used in conjunction with a lapping tool of the present invention. These figures show the relative motions of the lapping tool and wafer chuck during the lapping operation. Here, wafer pin chuck 60 is mounted on a movable table 62 that moves linearly left and right. A counterclockwise rotation is imparted to wafer pin chuck 60. This rotation holds treatment (lapping) tool 64 against a pair of rollers 66, 68 that are rotatably mounted to stationary arm 70. One or both of the rollers may be driven, thereby imparting a rotation to tool 64. The lapping machine does not apply downward (e.g., z-axis) pressure to the tool. Rather, simple dead weight loading presses tool 64 against the terminal (top) surface of the pins 61. Thus, the treatment tool is not highly constrained during the lapping process, and could even be minimally constrained.

FIG. 6C is a close-up perspective view of lapping tool 64 and rollers 66 and 68. This view is from behind the position of the view of FIG. 6B to better illustrate the rollers, tool, and their rotations.

The following table describes some typical operating parameters for the lapping machine:

| Part RPM (fixed) | 3.0 |
| Step From Edge (mm) (start position) | 3.5 |
| Linear Stage Travel (mm) | 109.0 |
| Linear Stage Feed Rate (mm/min.) | 0.9 |
| Lap Dia. (mm) OD (22 mm effective) | 37.5 |
| Lap weight (g) | 60.2 |
| Lap Shape | Toroidal |
| Lap Sample Number | D |
| Cycle Time | 2:01 |

To sum up this section, the lapping machine can be set up or programmed to have the lapping tool pass over the entire surface of the wafer pin chuck, or by preferentially treating the higher regions of the chuck support surface (i.e., deterministic treating). Vacuum may be applied in the center or around the edge of the chuck to remove particulate generated by correction. The treatment tool should be designed in a more-or-less of an annulus or toroidal shape so it will conformally seek a position normal to the surface even though the pin chuck is not perfectly flat. The free state or minimally restricted state of the tool will allow the tool to naturally, thus preferentially seek and 'hit, treat' the higher pins of the pin chuck, correcting for the flatness variation. The size of the annulus of the tool can be selected to 'treat' or correct high spots over a select spatial frequency range. The force applied can be kept fixed or varied depending on the features or edges to provide a more or less equal treatment allowing the natural state of the tool to define. The location of the tool and the local force can be controlled to effectively control and compensate for non-flat wear of the pin chuck in known patterns. The material of the pin chuck is composed of a similar or harder material than the pins such that the roughness is maintained in the top surface of the pins of the chuck. The applied pressure, dwell or velocity of the tool may also be adjusted to perform mostly cleaning rather than flattening/roughening. Cleaning is sometimes required because the wafer chuck pins can become contaminated with debris such as the chemicals used in semiconductor processing.

6. Flatness and Roughness Correction in Lithography Tool

The third aspect of the invention pertains to correcting the flatness and roughness of a pin chuck in a lithography tool.

Still another problem occurs during use of these "pin chucks", and that is that the edges tend to be subjected to greater wear than the interior of the wafer supporting surface. What is needed is a way to correct or refurbish these worn surfaces. Especially preferred would be a way to do this "in-situ", that is, while the chuck is still installed in a lithography machine, for example. Unfortunately, up until the instant invention, there has been no known method for in-situ flattening or correcting a pin chuck.

Now, however, the materials, articles and techniques of the instant invention turn out to be well suited for the in-situ flattening, roughening and/or cleaning of a reticulated or "pinned" wafer chuck support surface. More exactly, the present methods do not use loose grinding or lapping media but rather, a self-supporting disc-shaped tool. The amount of debris that is produced in lapping the pin tops is minimal. Furthermore, what debris is produced is pushed off of the pin tops and it falls harmlessly near the base or bottom of the pins. Thus, the debris is out of the way and will not affect the flatness or roughness of the pins, and does not pose a contamination problem.

EXAMPLES

The following examples illustrate with still more specificity several embodiments of the present invention. These examples are meant to be illustrative in nature and should not be construed as limiting the scope of the invention.

Example 1: Achieving Flatness

A 300 mm diameter semiconductor vacuum chuck was made from reaction bonded SiC ceramic (Si/SiC).

As is common in the industry, the top surface (i.e., wafer contact surface) of the chuck was EDM machined to have a plurality of pins (also known as mesas). The pins had a nominal diameter of 0.35 mm. The purpose of the pins is to minimize wafer to chuck contact area to less than 1.5 percent (area %), which enhances function by reducing backside wafer contamination issues, providing a uniform backside vacuum force, and easing wafer release from the chuck, among other advantages.

The top surface of the pin chuck was put into a flat state with traditional lapping, which is common in the industry. The flatness of the surface was measured by placing a Si wafer of known flatness on the pinned surface, applying vacuum, and measuring the top side of the wafer using a ZYGO interferometer. The surface is characterized at the die-site level with flatness (also known as moving average—MA—in nm) and slope (also known as slope-local-angle sLA—in—μrad). The area of the measurement is 28 mm×8 mm. The as-lapped pin chuck measured 4.76 nm MA (mean+3 standard deviations for all die sites across the 300 mm surface) and 1.60 μrad sLA (mean+3 standard deviations).

The surface of the pin chuck was then treated with the technology of the present invention. Specifically, a 22 mm OD by 3 mm ID toroidal-shaped annular tool was moved across the top of the pins using a load of nominally 60 g and tool radii of 27 mm. The tool was constructed from the same reaction bonded SiC formulation that was used to produce the pin chuck to provide a hard surface for efficient wear. The surface was treated with 50 passes. During this process, the tool moved laterally along the top of the pins, lightly abrading high spots. Upon completion of the process, the surface was again characterized yielding 3.97 nm MA and 1.07 μurad sLA.

To those skilled in the art, there are many process modifications that can be employed to change, alter and optimize the performance of the process, including geometry of the tool, construction material of the tool, number of passes, applied load, etc.

Example 2: Achieving Roughness

To those skilled in the art, it is valuable to have pin chucks with good flatness, as detailed in Example 1, to enhance semiconductor fabrication processes. However, the surface of the pins must also have some level of roughness. If the top surface of the pins is too smooth, the wafer and pin chuck can stick together by the principle of "optical contacting" (optical contacting is the phenomenon where two bodies will stick together upon contact if they are very flat and very smooth). Sticking of the wafer to the pin chuck results in many unwanted problems such as difficult de-chucking and saddling of the wafer as it tries to lay flat on the pin chuck.

Lapping with a coarse media (e.g., diamond lapping compound with a particle size of greater than or equal to 2 μm) is known to yield the desired coarse surface roughness on the top of the pins.

As with coarse particle lapping, the process of the present invention also provides the desired rough surface finish on the top of the pins.

A 300 mm pin chuck was brought to flatness with a conventional lapping process using 2 μm diamond particle media. The plateau roughness (Spq) was measured with a ZYGO white light interferometer, yielding 23.9 nm. This level of roughness is desired to prevent sticking of the wafer by optical contacting.

Similarly, a 300 mm pin chuck was brought to flatness using the technology of the present invention. Using the method of Example 1, a reaction bonded SiC annular work piece (lapping tool) was passed across the top of the pin chuck to wear-down high spots and enhance flatness. As a result of the flattening, the desired high surface roughness was maintained, or even enhanced. After the process, the Spq surface roughness was 26.1 nm.

Example 3: Wear Correction

During use, wafer pin chucks will wear and lose their flatness specification. The wear is from multiple sources, including thousands of silicon wafers sliding on and off the surface, contaminants being brought to the pin chuck from the back side of the wafer, machine vibration, handling, etc. An effective pin chuck refurbishment process is needed.

A pin chuck that had seen a high level of field use was obtained. Using the method described in Example 1, the flatness was measured yielding 6.0 nm MA and 2.0 μrad sLA. These values are unacceptably high.

This worn pin chuck was processed using the annular tool per the process described in Example 1. As a result of this processing, the flatness was improved to 5.4 nm MA and 1.8 μrad sLA, which provides additional life for the component.

To one skilled in the art, there are several extensions to this wear correction. First, additional surface treatments can be conducted to further enhance flatness. Second, the process and be conducted in the semiconductor machine tool (i.e., inside the semiconductor fabrication facility) rather than remotely, which saves the typical logistical costs of component refurbishment.

Example 4: Effect of Lap Tool Size on Spatial Frequency of Errors

Figure 7:
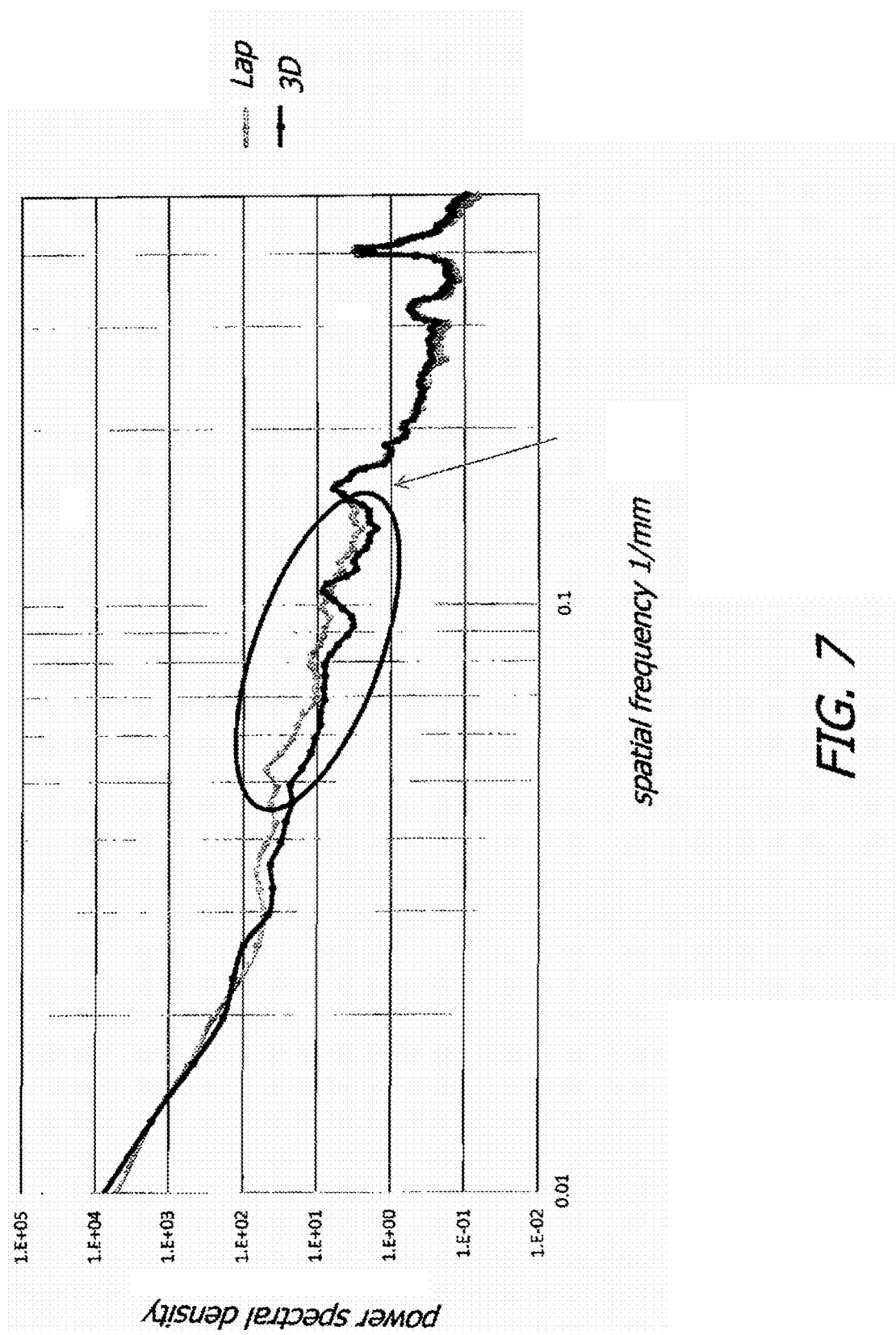
FIG. 7 is a graph plotting the degree of flatness errors as a function of spatial frequency before and, after lapping by a technique and tool of the present invention.

Referring to FIG. 7, what is shown is the well-known plot of "power spectral density" (PSD) as a function of spatial frequency for an optical surface. PSD is a mathematical function correlating to the flatness of an optical surface. The plot of FIG. 7 shows the effect of lapping a surface with a lapping tool of the present invention having a 28 mm annular contact area. Specifically, the graph shows that the lapping tool had an effect on flatness in the region of spatial frequencies close to the size of the tool.

Summary and Conclusions:

What is claimed as novel is a technique to use a small tool (sometimes referred to as a "puck" or "disc") with an annular shape to the contact area that is held in such a way as it can naturally 'ride' over the larger frequencies that are not needed to be corrected. This small puck corrects the high spots that it encounters by conventional mechanical means. The general tool shape of an annulus is one whose diameter is not needed to be any greater than 28 mm (thus working a surface feature that is less critical) but typically from 10-28 mm. The width of the annulus should also be specified and typically is on the order of the pin spacing or larger, but not large enough to prevent the tool from sufficiently conforming to the larger frequency surfaces. The treatment tool can be a toroidal ("doughnut") shape. More generally, it can be a continuous surface with a depression in the center and a roll on the edge, thus providing an annular contact area.

The flatness of the tool in the contact area, when viewed along the peak of the annulus, should be generated to a flatness level that exceeds the specifications of the wafer chuck in that region. This can be accomplished by optically polishing.

The material of the tool in contact with the pins should be of a material that is as hard or harder than the pins, which for this case is Si/SiC. The application of a material with equal hardness or greater (diamond for example) assures that the tool is equally or less worn that the magnitude of the removal from the wafer chuck, thus preserving the flatness condition during the lapping cycle.

The material and structure of the annular treatment tool should be designed with a material that is light and stiff enough to "float" over the surface but not so heavy as to compress pins. Nor should the tool material lack stiffness such that it sags between pins, resulting in conformally lapping pins that do not stick up. A preferred material for this structure may be Si/SiC, Si/SiC/B4C, or Si/SiC/Diamond, for example.

Applications of this lapping tool and methods include:
Flattening pin chucks for semiconductor lithography or inspection while maintaining roughness
Correction or addition of roughness while maintaining flatness
Correction of worn patterns in pin chucks

INDUSTRIAL APPLICABILITY

Components with a plurality of pins (or plateaus or mesas) on their surface are common in precision industries. The present invention focuses on semiconductor vacuum pin chucks that are used to hold wafers during processing. The technology in this invention allows the flatness and roughness of the pin tops to be optimized, and allows the pin top surfaces to be regenerated after field use. This technology is transferable to many other precision pin-top components, such as, but not limited to, electrostatic chucks with surface pins, reticle vacuum and electrostatic pin chucks, wafer handling arms, and components for flat panel display manufacture (glass chucks, glass handing arms, reticle chucks, etc.).

In addition, this technology is transferable to the surface modification (flattening, roughening, etc.) of surfaces that do not have pins. This provides value in preparing mirror and lens surfaces, both flat and curved.

An artisan of ordinary skill will appreciate that various modifications may be made to the invention herein described without departing from the scope or spirit of the invention as defined in the appended claims.

What is claimed is:

1. A tool for lapping a surface of a component, said tool comprising:
   (a) a contacting surface configured to contact the surface of the component, said contacting surface including a material of approximately equal or greater hardness than that of the surface of the component; and
   (b) when contacted with a plane, said contacting surface makes line contact, wherein said line contact consists of a closed loop.

2. The tool of claim 1, wherein said contacting surface has a toroidal shape.

3. The tool of claim 1, wherein said closed loop comprises a member selected from the group consisting of a circle, oval and ellipse.

4. The tool of claim 1, wherein the surface of the component is populated with pins.

5. The tool of claim 1, wherein the component comprises a member selected from the group consisting of a vacuum chuck, and electrostatic chuck, a wafer handling arm, a chuck for supporting a flat panel display, a glass handling arm, and a reticle chuck.

6. The tool of claim 1, wherein said material of aid contacting surface is the same as that of the surface of the component.

7. The tool of claim 1, wherein said contacting surface comprises a ceramic material.

8. The tool of claim 1, wherein said contacting surface comprises a material selected from the group consisting of SiC, B4C, and diamond.

9. The tool of claim 8, wherein said contacting surface comprises a composite of silicon and silicon carbide.

10. The tool of claim 1, wherein said contacting surface comprises a flatness that is flatter than a flatness of the wafer chuck support surface as measured across a diameter of said tool contacting surface.

11. The tool of claim 10, wherein said contacting surface comprises a flatness measurement less than 4.76 nm/mm diameter.

12. The tool of claim 10, wherein said contacting surface comprises a slope less than 1.68 microradians.

13. The tool of claim 1, wherein said contacting surface has a size that is less than a diameter of the wafer chuck support surface.

14. The tool of claim 13, wherein said contacting surface has a size that is on the order of a die size on a semiconductor wafer configured to be supported by the wafer chuck support surface.

15. The tool of claim 13, wherein said contacting surface has a size ranging from about 3 mm to about 28 mm in diameter.

16. The tool of claim 1, further comprising structure configured for attachment of said tool to a lapping machine.

17. The tool of claim 16, wherein said attachment structure comprises an attachment means of minimal constraint.

18. The tool of claim 17, wherein said attachment means of minimal constraint comprises a ball-and-socket joint.

19. The tool of claim 4, wherein a pressure that said tool applies against the pins is adjustable.

20. The tool of claim 4, configured to apply pressure against the pins by means of dead weight loading.

21. The tool of claim 1, configured to receive dead weight loading.

22. The tool of claim 1, configured as a collection of annular sub-tools arranged in a group.

23. A tool for lapping a wafer support surface of a wafer chuck, said surface comprising pins, said tool comprising:
   (a) a surface configured to contact the pins of the wafer support surface of the wafer chuck, said contacting surface including a material of approximately equal or greater hardness than that of said pins, said contacting surface having a size that is larger in extent than a spacing between two adjacent pins of the wafer support surface;
   (b) when contacted to a plane, said contacting surface making line contact with the plane, wherein said line contact consists of a circle;
   (c) said contacting surface having a toroidal shape; and
   (d) said contacting surface having a size that is less than a diameter of the wafer support surface.

24. The tool of claim 23, wherein said contacting surface has a diameter of at least 3 millimeters.

* * * * *